(12) United States Patent
Lee et al.

(10) Patent No.: US 11,350,171 B2
(45) Date of Patent: May 31, 2022

(54) ELECTRONIC APPARATUS AND CONTROLLING METHOD THEREOF

(71) Applicant: SAMSUNG ELECTRONICS CO., LTD., Suwon-si (KR)

(72) Inventors: Heeran Lee, Suwon-si (KR); Yongdeok Kim, Suwon-si (KR); Namsu Ha, Suwon-si (KR); Bongseok Lee, Suwon-si (KR); Jaeho Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 54 days.

(21) Appl. No.: 16/887,641

(22) Filed: May 29, 2020

(65) Prior Publication Data

US 2020/0382839 A1 Dec. 3, 2020

(30) Foreign Application Priority Data

May 31, 2019 (KR) .......................... 10-2019-0064568

(51) Int. Cl.
  *H04N 21/47* (2011.01)
  *H03G 1/00* (2006.01)
  *H04R 5/04* (2006.01)

(52) U.S. Cl.
  CPC .......... *H04N 21/47* (2013.01); *H03G 1/0088* (2013.01); *H04R 5/04* (2013.01)

(58) Field of Classification Search
  CPC combination set(s) only.
  See application file for complete search history.

(56) References Cited

U.S. PATENT DOCUMENTS

| 6,552,753 | B1 | 4/2003 | Zhurbinskiy et al. |
| 2004/0218514 | A1 | 11/2004 | Ieda et al. |
| 2007/0206820 | A1 | 9/2007 | Ikawa |

(Continued)

FOREIGN PATENT DOCUMENTS

| CN | 105323633 A | 2/2016 |
| ER | 1 681 765 A2 | 7/2006 |

(Continued)

OTHER PUBLICATIONS

Written Opinion (PCT/ISA/237) dated Sep. 3, 2020 issued by the International Searching Authority in International Application No. PCT/KR2020/006834.

(Continued)

*Primary Examiner* — Duc Nguyen
*Assistant Examiner* — Assad Mohammed
(74) *Attorney, Agent, or Firm* — Sughrue Mion, PLLC

(57) ABSTRACT

An electronic apparatus is provided. The electronic apparatus includes: a memory configured to store volume histories for a plurality of content sources; and a processor configured to, based on a content source for providing a content being changed from a first content source to a second content source, among the plurality of content sources, identify a volume level corresponding to the second content source based on a volume history of the first content source and a volume history of the second content source among the stored volume histories, and change a currently-set volume level to the identified volume level, and update the volume history of the second content source based on the changed volume level.

21 Claims, 10 Drawing Sheets

(56) References Cited

U.S. PATENT DOCUMENTS

| | | | |
|---|---|---|---|
| 2008/0118086 A1 | 5/2008 | Krig | |
| 2011/0181789 A1 | 7/2011 | Nishimura | |
| 2013/0346347 A1* | 12/2013 | Patterson | G06N 20/00 |
| | | | 706/12 |
| 2014/0143384 A1* | 5/2014 | Wong | G09G 5/003 |
| | | | 709/219 |
| 2016/0241907 A1* | 8/2016 | Pearson | H04N 21/43615 |
| 2018/0167045 A1 | 6/2018 | Roberts | |
| 2020/0374010 A1* | 11/2020 | DiDonato | H04B 10/1141 |

FOREIGN PATENT DOCUMENTS

| | | |
|---|---|---|
| JP | 2003-87142 A | 3/2003 |
| JP | 2004-260518 A | 9/2004 |
| JP | 2005-244684 A | 9/2005 |
| JP | 2006-025196 A | 1/2006 |
| JP | 2008-061062 A | 3/2008 |
| KR | 10-1993-0017291 A | 8/1993 |
| KR | 10-2003-0009639 A | 2/2003 |
| KR | 10-2019-0040784 A | 4/2019 |
| WO | 2005091671 A1 | 9/2005 |
| WO | 2009/122239 A1 | 10/2009 |

OTHER PUBLICATIONS

International Search Report (PCT/ISA/210) dated Sep. 3, 2020 issued by the International Searching Authority in International Application No. PCT/KR2020/006834.
Communication dated Jul. 21, 2020, from the European Patent Office in European Application No. 20176710.0.
Communication dated May 18, 2021, issued by the European Patent Office in counterpart European Application No. 20176710.0.

* cited by examiner

FIG. 6

| CASE | FIRST CONTENT SOURCE | SECOND CONTENT SOURCE | DIFFERENCE VALUE(dB) | CURRENTLY-SET VOLUME LEVEL | FIRST CONTENT SOURCE -> SECOND CONTENT SOURCE |
|---|---|---|---|---|---|
| | FIRST VOLUME INFORMATION | SECOND VOLUME INFORMATION | | | |
| 1 | VOLUME 10 (-33dB) | VOLUME 15 (-27dB) | 6dB | 12(-30dB) | 18(-24dB) |
| 2 | VOLUME 10 (-33dB) | VOLUME 20 (-22.5dB) | 10.5dB→10dB | 12(-30dB) | 25(-20dB) |
| 3 | VOLUME 10 (-33dB) | - | - | 12(-30dB) | 12(-30dB) |

FIRST CONTENT SOURCE -> SECOND CONTENT SOURCE

ELECTRONIC APPARATUS AND CONTROLLING METHOD THEREOF

CROSS-REFERENCE TO RELATED APPLICATION(S)

This application is based on and claims priority under 35 U.S.C. § 119 to Korean Patent Application No. 10-2019-0064568, filed on May 31, 2019, in the Korean Intellectual Property Office, the disclosure of which is incorporated by reference herein in its entirety.

BACKGROUND

1. Field

The disclosure relates to an electronic apparatus for adjusting a volume of a content and a controlling method thereof.

2. Description of Related Art

Recently, as content sources for providing content to TVs diversify, the content sources are frequently changed according to user preferences and situations. For example, a user may select a set-top box, an application installed on a TV, a smart phone, etc., as a content source and watch the content provided therefrom through the TV.

However, when the content source is changed, even though the TV volume level is the same, different volumes are provided according to the content source, causing inconvenience to the user as the user needs to control the volume separately.

SUMMARY

Provided are an electronic apparatus and method for identifying a volume optimized for a changed content source without a separate manipulation even if the content source is changed.

Additional aspects will be set forth in part in the description which follows and, in part, will be apparent from the description, or may be learned by practice of the presented embodiments.

In accordance with an aspect of the disclosure, an electronic apparatus includes: a memory configured to store volume histories for a plurality of content sources; and a processor configured to, based on a content source for providing a content being changed from a first content source to a second content source, among the plurality of content sources, identify a volume level corresponding to the second content source based on a volume history of the first content source and a volume history of the second content source among the stored volume histories, and change a currently-set volume level to the identified volume level, and update the volume history of the second content source based on the changed volume level.

The processor may be configured to: obtain a difference value between first volume information obtained based on the volume history of the first content source and second volume information obtained based on the volume history of the second content source; and identify the volume level corresponding to the second content source based on the obtained difference value and the currently-set volume level.

The processor may be configured to obtain decibel information corresponding to the second content source based on decibel information corresponding to the obtained difference value and decibel information corresponding to the currently-set volume level, and identify a volume level corresponding to the obtained decibel information as the volume level corresponding to the second content source.

The volume history of the first content source and the volume history of the second content source may each include volume information for each of a plurality of time periods; and the processor may be configured to: obtain first volume information of a time period corresponding to a present time based on the volume information for each of the plurality of time periods of the first content source, obtain second volume information of the time period corresponding to the present time based on the volume information for each of the plurality of time periods of the second content source, and identify the volume level corresponding to the second content source based on an obtained difference value between the first volume information and the second volume information and the currently-set volume level.

The volume history of the first content source and the volume history of the second content source may each include volume information for each of a plurality of time periods; and the processor may be configured to update volume information for at least one corresponding time period from among the plurality of time periods for the volume history of the second content source based on volume information and time information during a time in which the second content source is providing content.

The processor may be configured to, based on at least one of an event in which the content source is changed, an event in which a turn-on state of the electronic apparatus is changed, or an event in which a volume setting is changed occurring, update the volume history of the second content source stored in the memory.

The processor may be configured to, based on a content being provided from the second content source for a threshold length of time or more, update the volume history of the second content source based on the changed currently-set volume level.

The volume history of the first content source and the volume history of the second content source may each include volume information for time periods corresponding to a weekday and volume information for time periods corresponding to a weekend.

The apparatus may further include: a display, wherein the processor may be configured to control the display to display a volume user interface (UI) indicating the changed currently-set volume level.

The processor may be configured to manage the volume histories for the plurality of content sources using a learning network model.

In accordance with another aspect of the disclosure, a controlling method of an electronic apparatus that stores volume histories for a plurality of content sources includes: based on a content source for providing a content being changed from a first content source to a second content source, among the plurality of content sources, identifying a volume level corresponding to the second content source based on a volume history of the first content source and a volume history of the second content source among the stored volume histories, and changing a currently-set volume level to the identified volume level, and updating the volume history of the second content source based on the changed volume level.

The identifying the volume level may include: obtaining a difference value between first volume information obtained based on the volume history of the first content source and second volume information obtained based on the volume history of the second content source, and identifying the volume level corresponding to the second content source based on the obtained difference value and the currently-set volume level.

The identifying the volume level based on the obtained difference value and the currently-set volume level may include obtaining decibel information corresponding to the second content source based on decibel information corresponding to the obtained difference value and decibel information corresponding to the currently-set volume level, and identifying a volume level corresponding to the obtained decibel information as the volume level corresponding to the second content source.

The volume history of the first content source and the volume history of the second content source may each include volume information for each of a plurality of time periods; and the identifying the volume level may include: obtaining first volume information of a time period corresponding to a present time based on the volume information for each of the plurality of time periods of the first content source, obtaining second volume information of the time period corresponding to the present time based on the volume information for each of the plurality of time periods of the second content source, and identifying the volume level corresponding to the second content source based on an obtained difference value between the first volume information and the second volume information and the currently-set volume level.

The volume history of the first content source and the volume history of the second content source may each include volume information for each of a plurality of time periods; and the updating may include updating volume information for at least one corresponding time period from among the plurality of time periods for the volume history of the second content source based on volume information and time information during a time in which the second content source is providing content.

The updating may include, based on at least one of an event in which the content source is changed, an event in which a turn-on state of the electronic apparatus is changed, or an event in which a volume setting is changed occurring, updating the volume history of the second content source.

The updating may include, based on a content being provided from the second content source for a threshold length of time or more, updating the volume history of the second content source based on the changed currently-set volume level.

The volume history of the first content source and the volume history of the second content source may each include volume information for time periods corresponding to a weekday and volume information for time periods corresponding to a weekend.

The method may further include: displaying a volume UI indicating the changed currently-set volume level.

The updating may include managing the volume histories for the plurality of content sources using a learning network model.

In accordance with another aspect of the disclosure, a non-transitory computer-readable recording medium has recorded thereon instructions executable by a processor to perform the above method.

In accordance with another aspect of the disclosure, an electronic apparatus includes: a memory configured to store instructions; and a processor configured to execute the instructions to: based on a content source for providing a content being changed from a first content source to a second content source, identify a volume level corresponding to the second content source based on a volume history of the first content source and a volume history of the second content source, and change a currently-set volume level to the identified volume level The processor may be further configured to execute the instructions to control to update the volume history of the second content source based on the changed volume level.

The processor may be further configured to execute the instructions to: obtain a difference value between first volume information obtained based on the volume history of the first content source and second volume information obtained based on the volume history of the second content source; and identify the volume level corresponding to the second content source based on the obtained difference value and the currently-set volume level.

The processor may be further configured to execute the instructions to obtain decibel information corresponding to the second content source based on decibel information corresponding to the obtained difference value and decibel information corresponding to the currently-set volume level, and identify a volume level corresponding to the obtained decibel information as the volume level corresponding to the second content source.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 6 is a view provided to explain an operation of identifying a volume level corresponding to a second content source according to an embodiment;

DETAILED DESCRIPTION

Figure 1:
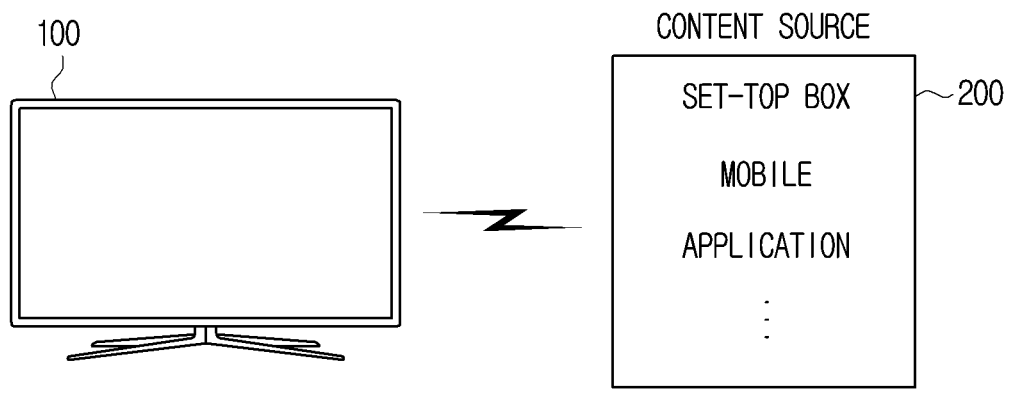
FIG. 1 is a view provided to schematically explain configuration of an electronic system according to an embodiment.

Hereinafter, one or more embodiments will be described in detail with reference to the accompanying drawings.

The terms used in this specification will be described briefly, and then the exemplary embodiments will be described in detail.

As for the terms used in the detailed description, general terms that are currently used in the art are used herein in consideration of the functions described in the disclosure. However, the terms may vary depending on the intention of those skilled in the art who work in the pertinent field, previous court decisions or emergence of new technologies. Also, in particular cases, there may be terms that were designated by the applicant, and in such cases, the meaning of the terms may be described in detail in the relevant descriptions in the disclosure. Thus, the terms used in the disclosure should be defined based on the meaning of the terms and the overall content of the disclosure, but not just based on the names of the terms.

Further, various modifications may be made to the embodiments of the disclosure, features from one embodiment may be combined into or with another embodiment, and there may be various types of embodiments. Accordingly, specific embodiments will be illustrated in drawings, and embodiments will be described in detail in the detailed description. However, it should be noted that the various embodiments are not for limiting the scope of the disclosure to a specific embodiment, but they should be interpreted to include all modifications, equivalents, combinations, or alternatives of the embodiments included in the ideas and the technical scopes disclosed herein.

Singular forms are intended to include plural forms unless the context clearly indicates otherwise. In the present description, the terms "include" and "comprise" designate the presence of features, numbers, steps, operations, components, elements, or a combination thereof that are written in the specification, but do not exclude the presence or possibility of addition of one or more other features, numbers, steps, operations, components, elements, or a combination thereof.

In the description, expressions such as "at least one of A [or/and] B" should be understood to mean any of "A," "B," or "A and B."

Terms such as "first," "second," or the like, used in the disclosure may indicate various components regardless of a sequence and/or importance of the components, will be used in order to distinguish one component from the other components, and do not otherwise limit the corresponding components.

When it is mentioned that any component (for example, a first component) is (operatively or communicatively) coupled with/to or is connected to another component (for example, a second component), it is to be understood that the component is directly coupled with/to another component or may be coupled with/to another component through an different other component (for example, a third component).

In the present disclosure, a "module" or a "unit" performs at least one function or operation and may be implemented by hardware or software or a combination of the hardware and the software. In addition, a plurality of "modules" or a plurality of "units" may be integrated into at least one module and may be (or implemented in) at least one processor except for "modules" or "units" that should be or are realized in a specific hardware. In the disclosure, the term "user" may refer to a person who uses an electronic apparatus or a device using an electronic apparatus (e.g., an artificial intelligence electronic apparatus).

Embodiments of the disclosure will be described in greater detail below in a manner that will be understood by one of ordinary skill in the art. However, embodiments may be realized in a variety of different configurations, and not limited to descriptions provided herein. Also, in order to describe the present disclosure clearly, similar reference numbers are used for similar parts.

Hereinafter, an embodiment will be described in greater detail with reference to the accompanying drawings.

FIG. 1 is a view provided to schematically explain configuration of an electronic system 10 according to an embodiment.

Referring to FIG. 1, an electronic system 10 according to an embodiment includes an electronic apparatus 100 and a content source 200.

The electronic apparatus 100 is an apparatus capable of receiving a content from the content source 200, and may be implemented as a display device such as a television (TV), but is not limited thereto. The electronic apparatus 100 may be implemented as an image processing apparatus without a display, for example, a set-top box, a Blu-ray player, an audio/video receiver, a media playing device, an intermediate source device, and the like. In this case, the image processing apparatus may be configured to receive a content and transmit the content to a display device (e.g., a monitor, a TV, etc.). Alternatively, the electronic apparatus 100 may be implemented as various types of apparatuses such as a personal computer (PC), a laptop computer, a tablet PC, a smart phone, and the like.

The content source 200 is a subject that provides a content to the electronic apparatus 100. The content source 200 may include at least one of a content provider or a content providing device. Here, the content provider may provide a content through a server using an application (e.g., YOUTUBE™, NETFLIX™, etc.) installed in the electronic apparatus 100. The content providing device may be implemented as a set-top box, a Blue-ray player, a mobile phone, or the like that is connected to the electronic apparatus 100.

Meanwhile, even if the same volume level is set in the TV, the volume of sound heard by a user may be different depending on each content source. For example, if the user changes the content source to a set-top box while watching a content via NETFLIX™, the volume of sound heard by the user is lower than before and thus, the user may need a separate manipulation to increase the volume level.

Hereinafter, various embodiments of, when (or based on) the content source is changed, automatically changing the volume by predicting a volume optimized for the changed content source based on the volume history of each content source will be described in detail.

Figure 2:
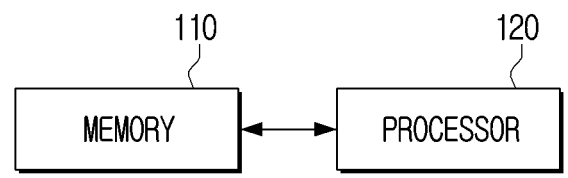
FIG. 2 is a block diagram provided to explain an operation of an electronic apparatus according to an embodiment.

FIG. 2 is a block diagram provided to explain an operation of an electronic apparatus 100 according to an embodiment.

Referring to FIG. 2, the electronic apparatus 100 includes a memory 110 and a processor 120.

The memory 110 is electrically connected to the processor 120, and may store data for (e.g., necessary for) various embodiments of the present disclosure.

The memory 110 may be implemented in the form of a memory embedded in the electronic apparatus 100 according to a data storage purpose, or may be implemented in the form of a memory detachable from the electronic apparatus 100. For example, in the case of data for driving the electronic apparatus 100, the data may be stored in a memory embedded in the electronic apparatus 100. In the case of data for an expansion function of the electronic apparatus 100, the data may be stored in a memory detachable from the electronic apparatus 100. Meanwhile, the memory embedded in the electronic apparatus 100 may be implemented as at least one of a volatile memory (e.g., dynamic RAM (DRAM), static RAM (SRAM), or synchronous dynamic RAM (SDRAM), and the like), a non-volatile memory (e.g., one time programmable ROM (OTPROM), programmable ROM (PROM), erasable and programmable ROM (EPROM), electrically erasable and programmable ROM (EEPROM), mask ROM, flash ROM, flash memory (e.g., NAND flash or NOR flash, etc.), a hard drive, or a solid state drive (SSD). The memory detachable from the terminal device 100 may be implemented in the form of a memory card (e.g., compact flash (CF), secure digital (SD), micro secure digital (Micro-SD), mini secure digital (Mini-SD), extreme digital (xD), multi-media card (MMC), etc.), an external memory connectable to a USB port (e.g., a USB memory), and the like.

According to an embodiment, the memory 110 stores a volume history for each content source 200. Here, the volume history for each content source 200 may be information regarding a volume level for each time slot set by a user for each content source 200. The memory 110 may store, for example, information regarding a volume level for each time slot in the form of a lookup table for each identification information of each content source.

In addition, the memory 110 may store identification information for each content source 200 that provides a content to the electronic apparatus 100. Here, the identification information may include at least one of a unique identification number, an identification name, an identification image, etc., of the content source 200.

The processor 120 is electrically connected to the memory 110, and controls the overall operations of the electronic apparatus 100.

According to an embodiment, the processor 120 (e.g., at least one processor) may be implemented as a digital signal processor (DSP) processing a digital signal, a microprocessor, or a time controller (TCON). It is understood, however, that one or more other embodiments are not limited thereto, and the processor 120 may include one or more of a central processing unit (CPU), a micro controller unit (MCU), a micro processing unit (MPU), a controller, an application processor (AP) or a communication processor (CP), an ARM processor, or an Artificial Intelligence (AI) processor, or may be defined as the corresponding term. In addition, the processor 120 may be implemented by a system-on-chip (SoC) or a large-scale integration (LSI) in which a processing algorithm is embedded, or may be implemented in a field programmable gate array (FPGA) form. The processor 120 may perform various functions by executing computer-executable instructions stored in the memory 110.

If (e.g., based on) the content source 200 that provides a content is changed, the processor 120 may automatically change a currently-set volume level to a volume level corresponding to the changed content source.

According to an embodiment, when (e.g., based on) the content source 200 that provides a content is changed from a first content source to a second content source, the processor 120 may identify a volume level corresponding to the second content source based on at least one of the volume history of the first content source and the volume history of the second content source. Here, the content source 200 is a subject that provides a content to the electronic apparatus 100, and may be implemented as an application (e.g., YOUTUBE™, NETFLIX™, etc.) installed in the electronic apparatus 100 or an external device or an external server such as a set-top box, a Blu-ray player, a mobile phone, an Internet server, etc.

Figure 8:
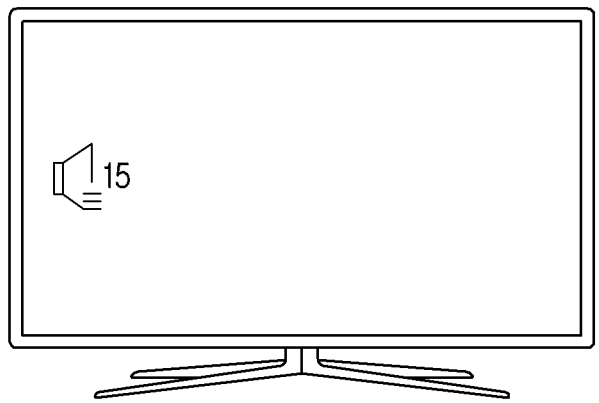
FIG. 8 is a view provided to explain a volume user interface (UI) according to an embodiment.

The volume history may include a volume level set by a user for each content source 200 and time information used for each volume level. The volume level is a volume level unit displayed in a volume UI on a display, and the volume level unit refers to a value set by a manufacturer by converting the volume size (e.g., decibel) into a preset number. For example, as illustrated in FIG. 8, "15" represents a volume level unit and a currently-set volume level.

The processor 120 may identify whether the content source 200 is changed based on identification information of the content source 200. Here, the identification information of the content source 200 may be information included in Infoframe. The Infoframe has a structure including data transmitted from a source to a sink, and such data may include a video stream, an audio stream, identification information, etc. The identification information may include at least one of the unique identification number, the identification name, etc., of the content source 200. However, this is only an example, and the processor 120 may identify whether the content source 200 is changed using various information such as source at least one of identification information included in a captured screen, metadata included in the content, etc.

Meanwhile, the processor 120 may obtain volume information of each content source 200 from a volume history of each content source 200. The volume information refers to information calculated, determined, or obtained for each content source 200 based on each volume history and may be a target volume level reflecting a user preference.

For example, assuming that a content is provided from the first content source at volume 10 for 1 hour and at volume 12 for another 1 hour, the processor 120 may obtain 11 as the first volume information, which is the target volume level of the first content source, based on the volume level and the time information. In other words, the volume information may be calculated as an average value based on the volume level and the time information. However, this is only an example, and the maximum value of previous volume levels may be obtained as the first volume information according to another embodiment. For example, according to another embodiment, the maximum volume of 12 may be obtained as the first volume information. According to another embodiment, the most common most often-used volume level may be obtained as the first volume information. The second volume information may be obtained in a similar manner as the first volume information.

The processor 120 may obtain the first volume information based on the volume history of the first content source and the second volume information based on the volume history of the second content source as described above.

Subsequently, according to an embodiment, the processor 120 may obtain a difference value between the first volume information and the second volume information, and identify a volume level corresponding to the changed second content source based on the obtained difference value and the currently-set volume level.

Specifically, the processor 120 may calculate the volume level corresponding to the second content providing source based on the [mathematical equation 1] as follows.

New volume=current volume+(Target_Estimated_Vol−Current_Estimated_Vol)  [Mathematical equation 1]

Here, the new volume represents a volume level corresponding to the changed content source (the second content source), the current volume represents a volume level which is currently set, the Target_Estimated_Vol represents the second volume information obtained based on the volume history of the changed content source (the second content source), and the Current_Estimated_Vol represents the first volume information obtained based on the volume history of the content source before the change (the first content source).

Here, the difference value between the first volume information and the second volume information represents a relative volume difference between the first content source and the second content source. For example, the larger the difference value, the larger the volume level to be changed when switching between the first content source and the second content source.

The processor 120 may identify a volume level corresponding to the changed content source by adding the obtained difference value between the first volume information and the second volume information to the currently-set volume level. For example, if the currently-set volume level is changed to a volume level corresponding to the second volume level based simply on the second volume information without considering the currently-set volume level, the current peripheral state of the electronic apparatus 100 is not reflected and thus, an optimal sound may not be provided.

For example, it is assumed that the target volume level of the first content source is 10 (i.e., when the first volume information is 10) and the second volume level of the second content source is 12. In other words, if the first content source is changed to the second content source, a user may hear natural sound without a separate volume manipulation when the volume level is increased. However, it is assumed that a content is provided from the first content source and there is excessive noise around the electronic apparatus 100 and thus, the currently-set volume level is 15. In this case, when the content source is changed to the second content source and the volume level is changed to 12 simply according to the second volume information, the volume level is decreased. Accordingly, in order to resolve this problem, the processor 120 may determine the degree of change of the volume level by obtaining a difference value between the first volume information and the second volume information and reflect the currently-set volume level by adding the difference value to the currently-set volume level.

By way of another example, when (or based on) the volume is adjusted to a volume level that differs from the currently-set volume level of the volume information that is a target volume level of the corresponding source by more than a threshold value, the processor 120 may not store the corresponding volume usage history in the volume history of the corresponding content source 200.

The volume level that differs from the currently-set volume level or the volume information that is the target volume level of the corresponding content source by more than a threshold value may not be a volume level that is set in a general environment, for example, in an environment when a volume level is increased greatly due to a loud noise resulting from an external construction or when a volume level is decreased greatly in order to recognize the broadcasting from an apartment management room. Accordingly, the processor 120 may recognize the volume level that differs from the currently-set volume level or the volume information that is the target volume level of the corresponding content source by more than a threshold value as a volume level in an exceptional situation and may not store the same in the volume history.

The processor 120 may obtain decibel information corresponding to the second content source based on the decibel information corresponding to the difference value between the first volume information and the second volume information and the decibel information corresponding to the currently-set volume level. In other words, the processor 120 may obtain the first volume information, the second volume information and the currently-set volume level in volume level units and convert the obtained volume levels into corresponding decibel information. Specifically, the processor 120 may convert the volume level units into the decibel units based on a volume curve graph. The volume curve graph is described in detail below with reference to FIG. 4.

Specifically, the processor 120 may convert the first volume information, the second volume information and the currently-set volume level into decibel units and calculate the target volume corresponding to the second content source in decibel units. In other words, the new volume (target volume corresponding to the second content source) in units of decibels may be identified through the above-described [mathematical equation 1] with the changed information in units of decibels and then converted into units of volume levels again based on the volume curve graph. Therefore, the processor 120 may display a volume level in units of volume levels on the display.

For example, it is assumed that the first volume information is 10 (−33 dB), the second volume information is 15 (−27 dB), and the first content source is changed to the second content source. In this case, the processor 120 may identify the difference value between the first volume information and the second volume information as the difference value of the decibel information (−27−(−33)=6 dB), not the difference value of the volume level (15−10=5). If the currently-set volume level is 12 (−30 dB), the processor 120 may calculate the new volume (target volume corresponding to the second content source) of "−24 dB" by adding "−30 dB (decibel information corresponding to the currently-set volume level)" to "6 dB (decibel information corresponding to the difference value)." The processor 120 may identify the volume level corresponding to −24 dB as 18 based on the volume curve graph.

Subsequently, the processor 120 may change the currently-set volume level to the identified volume level corresponding to the second content source.

In addition, the processor 120 may control the display to display a volume UI representing the changed volume level.

For example, the processor 120 may change the currently set volume level of 12 to the identified volume level of 18 based on the difference value between the first volume information and the second volume information and the currently-set volume level, and display the changed volume level of 18 on the display for a predetermined time.

In this case, as the content source is changed, the volume level is increased by 6, which may be a volume level optimized for a user since the volume level is based on the volume history for each content source.

Meanwhile, if (or based on) the difference value between the first volume information and the second volume information is more than a threshold value, the processor 120 may identify the difference value between the first volume information and the second volume information as a threshold value. For example, it is assumed that the volume history of the first content source and the second content source is generated according to the history that the threshold value of the difference value between the first volume information and the second volume information is 10 dB, the content according to the first content source is provided for 3 hours at the volume level of 9, the content according to the second content source is provided for 3 hours at the volume level of 19 and for 3 hours at the volume level of 21.

In this case, the first volume information is 10 (−33 dB) and the second volume information is 20 (−22.5 dB) based on the above-described [mathematical equation 1]. As such, it is assumed that a content is provided from the current first content source after the volume history of the first content source and the second content source is generated and the set volume level is 12 (−30 dB). Subsequently, when the content source is changed to the second content source, the difference value between the first volume information (−33 dB) and the second volume information (−22.5 dB) is 10.5 dB. However, when the difference value between the first volume information and the second volume information is equal to or greater than 10 dB, it is set to 10 dB. Thus, the difference value between the first volume information and the second volume information may be 10 dB, not 10.5 dB. The processor 120 may calculate the decibel information of the changed second content source as −20 dB by adding the difference value (10 dB) to the decibel information (−30 dB) corresponding to the currently-set volume level (12). Based on the volume curve graph, −20 dB corresponds to the volume level of 25. Accordingly, if the content source is changed from the first content source to the second content source, the processor 120 may identify or determine a sound of −20 dB and display a volume UI including the volume level of 25 on a display 150 for a predetermined time. As such, the maximum value of the difference value between the first volume information and the second volume information may be set as a threshold value to prevent a sudden increase in decibels when the content source is changed, thereby providing the user with a natural listening feeling.

Meanwhile, the volume history of each of the first content source and the second content source may include volume information for each time section (or time period). Here, the time section means a section that is distinguished by hours, minutes or seconds.

The processor 120 may obtain the first volume information of a time section corresponding to the present time based on volume information of each time section of the first content source, obtain the second volume information of a time section corresponding to the present time based on volume information of each time section of the second content source, and identify a volume level corresponding to the second content source based on the difference value between the obtained first volume information and second volume information and the currently-set volume level.

The case in which the volume history of each of the first content source and the second content source is divided by hours is described in detail below with reference to FIG. 5.

Figure 5:
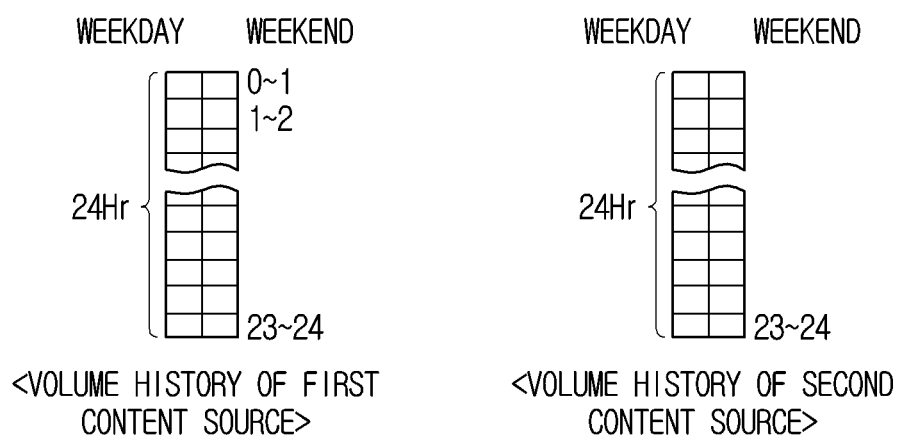
FIG. 5 is a view provided to explain a volume history divided into time sections according to an embodiment.

FIG. 5 is a view provided to explain a volume history divided into time sections according to an embodiment.

FIG. 5 illustrates the volume history of the first content source and the second content source, which is divided according to hours.

For example, the volume history may be divided into 24 time sections such as [0 to 1 o'clock] section, [1 to 2 o'clock] section, [2 to 3 o'clock] section, etc. If the source providing a content to the electronic apparatus 100 is changed from the first content source to the second content source at 17:30, the processor 120 may obtain the first volume information based on the volume history of [17 to 18 o'clock] section of the first content source, and obtain the second volume information based on the volume history of [17 to 18 o'clock] section of the second content source. Subsequently, the processor 120 may identify a volume level corresponding to the second content source based on the difference value between the first volume information and the second volume information obtained in the [17 to 18 o'clock] section and the volume level set at 17:30. Accordingly, the processor 120 may change the set volume level to the identified volume level.

Meanwhile, the processor 120 may update information of at least one corresponding time section from the volume history of the second content source based on the volume information and the time information during the time when the second content source is provided.

For example, if a content is provided from the second content source from 17:30 to 18:30, the processor 120 may update the volume history information of the [17 to 18 o'clock] section and the [18 to 19 o'clock] section by storing the volume level usage history between 17:30 and 18 in the [17 to 18 o'clock] section and the volume level usage history between 18 and 18:30 in the [18 to 19 o'clock] section.

Meanwhile, according to an embodiment, the volume history of each of the first content source and the second content source may include volume information of each time section corresponding to the weekday and volume information of each time section corresponding to the weekend. In other words, the history of each content source may be generated by dividing weekdays and weekends.

Accordingly, when the content source is changed, the processor 120 may obtain the first volume information and the second volume information by considering not only the present time information but also the day of week information. For example, the first volume information based on the volume history of the [17 to 18 o'clock] section on Wednesday may be 10 while the first volume information based on the volume history of the [17 to 18 o'clock] on Saturday may be 13.

In FIG. 5, it is assumed that the volume history of the first content source and the second content source is divided by hours, but it is understood that this is just an example and one or more other embodiments are not limited thereto. For example, the volume history according to another embodiment may be divided by minutes or seconds. In addition, the volume history may be generated by further subdividing and distinguishing the volume usage history by each day of the week.

Referring back to FIG. 2, if (or based on) at least one of an event where the content source 200 is changed, an event where the turn-on state of the electronic apparatus 100 is changed, or an event where the volume setting is changed occurs, the processor 120 may update the volume history stored in the memory 110.

For example, if (or based on) the volume level of the first content source is changed from 10 to 12 at 18:00, the processor 120 may update the volume history of the first content source corresponding to the time section where the volume level is maintained at 10.

In addition, if (or based on) the content source is changed from the first content source to the second content source at 18:00, the processor 120 may update the volume history of the first content source based on the volume level in the time section where the first content source is maintained.

Meanwhile, if (or based on) a content is provided from the changed second content source for more than a threshold length of time, the volume history of the second content source may be updated based on the changed volume level. In other words, if the content is provided for less than the threshold time, the processor 120 may not update the volume history based on the volume level that is used for the corresponding time. Only the volume level that is used for more than the threshold time may be determined to be used to update the history as meaningful information. For example, if the user unintentionally changes the content source to the second content source, the user may change the content source back to the intended source within a short time. In this case, it is desirable not to use the volume level used while the content provided from the second content source is output to update the volume history of the second content source.

Meanwhile, the processor 120 may activate or inactivate the volume history according to a user setting. If the volume history is activated, when (or based on) the content source is changed as described above, the processor 120 may provide a target volume level corresponding to the changed content source, and if the volume history is inactivated, the processor 120 may not perform a separate volume manipulation.

In addition, the processor 120 may generate different volume histories for each user. For example, the processor 120 may generate the volume history of the first content source and the volume history of the second content source of the first user, and separately generate the volume history of the first content source and the volume history of the second content source of the second user. The current user may be identified by a separate manipulation of the user, and the processor 120 may identify the user based on biometric information such as voice through a microphone, fingerprint and iris.

Accordingly, the target volume level provided from each content source may be different for each user.

Meanwhile, the processor 120 may manage the volume history for each content source using a learning network model. Here, the learning network model may be a model that manages the volume history based on training data and predicts a target volume level corresponding to each content source therefrom. The learning network model may be implemented as a cognitive system such as an artificial neural network or a neuromorphic processor. For example, the learning network model may be implemented as a Recurrent Neural Network (RNN), a Deep Neural Network (DNN), a Convolutional Neural Network (CNN), and the like.

The learning network model may learn a volume history to identify a target volume level for each content source, and relearn using the identified target volume level as training data.

Figure 3:
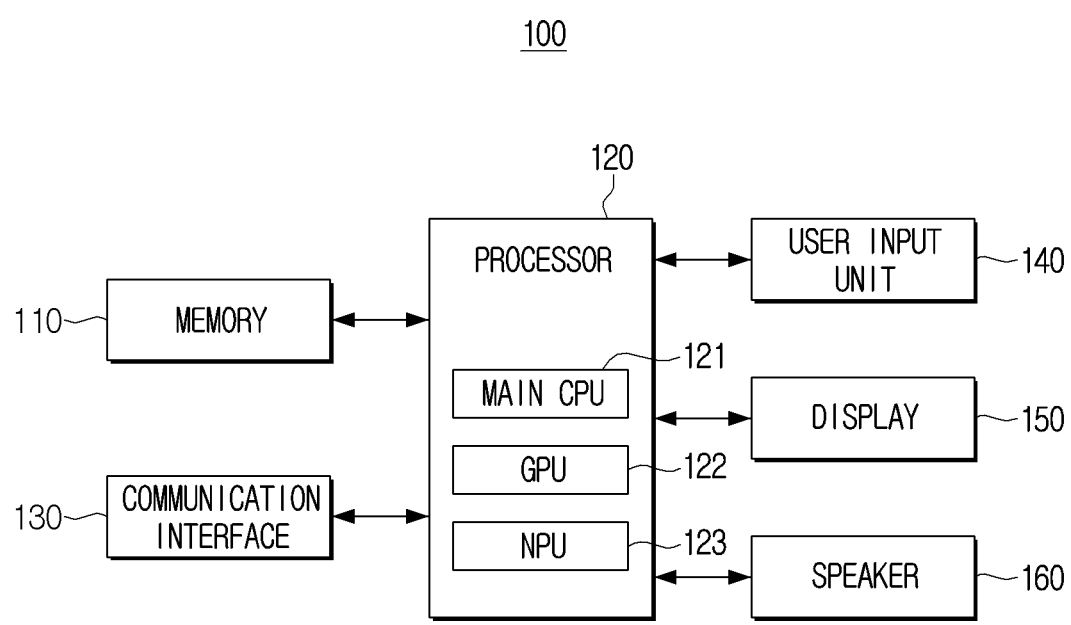
FIG. 3 is a block diagram provided to explain a detailed configuration of an electronic apparatus according to an embodiment.

FIG. 3 is a block diagram provided to explain detailed configuration of an electronic apparatus 100.

Referring to FIG. 3, the electronic apparatus 100 includes the memory 110, the processor 120, a communication interface 130, a user input unit 140, a display 150 and a speaker 160. Among the elements illustrated in FIG. 3, a redundant description of the elements overlapping with those in FIG. 2 may be omitted.

The processor 120 (e.g., at least one processor) controls the overall operations of the electronic apparatus 100 using various programs and/or instructions stored in the memory 110. The processor 120 may include a graphic processing unit 122 for graphic processing corresponding to an image. The processor 120 may be implemented as System On Chip (SoC) including a core and the GPU 122. The processor 120 may include a single core, dual cores, triple cores, quad cores and multiple cores thereof.

Meanwhile, the processor 120 includes a main central processing unit (CPU) 121, the graphics processing unit (GPU) 122 and a neural processing unit (NPU) 123.

The main CPU 121 accesses the memory 110, and performs booting by using the operating system (O/S) stored in the memory 110. Also, the main CPU 121 performs various operations by using various programs, content data, etc., stored in the memory 110. In particular, according to an embodiment, the main CPU 121 may copy a program in the memory 110 to a RAM according to a command stored in a ROM, and access the RAM and execute the program.

The GPU 122 may correspond to a processing device of a high performance for graphic processing, and may be a specialized electronic circuit designed to accelerate generation of an image in a frame buffer that will process the memory swiftly and change it, and output the image on a screen. Also, the GPU 122 may include or refer to a visual processing unit (VPU).

The NPU 123 may correspond to an artificial intelligence (AI) chipset (or an AI processor), and may also be an AI accelerator. Also, the NPU 123 may correspond to a processor chip optimized for performing a deep neural network. Meanwhile, the NPU 123 may correspond to a processing device that executes a deep learning model instead of the GPU 122, and/or may correspond to a processing device that executes a deep learning model together with the GPU 122.

The communication interface 130 including circuitry is configured to communicate with the content source 200. Specifically, the communication interface 130 may receive a content and identification information from each content source 200.

The communication interface 130 may include a WiFi module, a Bluetooth module, a Local Area Network (LAN) module, a wireless communication module and the like. Here, each communication module may be implemented in the form of at least one hardware chip. The wireless communication module may include at least one communication chip that performs communication according to various wireless communication standards such as Zigbee, Ethernet, Universal Serial Bus (USB), Mobile Industry Processor Interface Camera Serial Interface (MIPI CSI), 3rd Generation (3G), 3rd Generation Partnership Project (3GPP), Long Term Evolution (LTE), LTE Advanced (LTE-A), 4th Generation (4G), 5th Generation (5G), and the like. However, this is only an example, and the communication interface 130 may use at least one communication module from among various communication modules. For example, if the content source 200 is implemented as a smart phone using a mirroring function, the communication interface 130 may be implemented as a WiFi module and receive a content from the smart phone. Alternatively, if the content source 200 is implemented as an application installed in the electronic apparatus 100, the application receives a content from an external server and the communication interface 130 may be used for this operation.

In addition, the communication interface 130 may include an input/output interface. Specifically, the communication interface 130 may be implemented as one interface from among High Definition Multimedia Interface (HDMI), Mobile High-Definition Link (MHL), Universal Serial Bus (USB), Display Port (DP), Thunderbolt, Video Graphics Array (VGA) port, RGB port, D-subminiature (D-SUB), and Digital Visual Interface (DVI) and receive a content and identification information from the content source 200. For example, if the content source 200 is implemented as a set-top box, a content may be transmitted from the set-top box connected via HDMI.

The user input unit 140 is configured to receive various user commands and information. The processor 120 may execute a function corresponding to a user command input through the user input unit 140 or store information input through the user input unit 140 in the memory 110.

The user input unit 140 may receive a command to change the content source 200, a command to change a volume level, etc., from a user. The user input unit 140 may include a microphone for receiving a user command in the form of voice or may be implemented as a display (a touch screen) for receiving a user command in the form of a touch.

The display 150 may be implemented in the form of a touch screen having an interlayered structure with a touch pad. Here, the touch screen may be configured to detect not only the touch input position and size, but also the touch input pressure.

The display 150 may be implemented in various forms such as a liquid crystal display (LCD), an organic light-emitting diode (OLED), Liquid Crystal on Silicon (LCoS), Digital Light Processing (DLP), a quantum dot (QD) display panel and the like.

The electronic apparatus 100 may be implemented as an electronic apparatus (e.g., a TV) having the display 150 as illustrated in FIG. 3, but the electronic apparatus 100 may also be implemented as a set-top box, a Blu-ray player, etc., without the display 150 so that the electronic apparatus 100 may receive a content and transmit the received content to an external display device (e.g., a TV, a monitor, a projector, etc.) through the communication interface 130.

The speaker 160 is configured to output sound in decibels corresponding to the volume level identified according to the content source based on the currently-set volume level or the volume history.

The electronic apparatus 100 may be implemented as an electronic apparatus (e.g., a TV) having the speaker 160 as illustrated in FIG. 3, but may be implemented as an electronic apparatus without the speaker 160 such as a set-top box, etc., so that the electronic apparatus 100 may receive a content and transmit the received content (and a volume setting) to an external device including a speaker through the communication interface 130.

Figure 4:
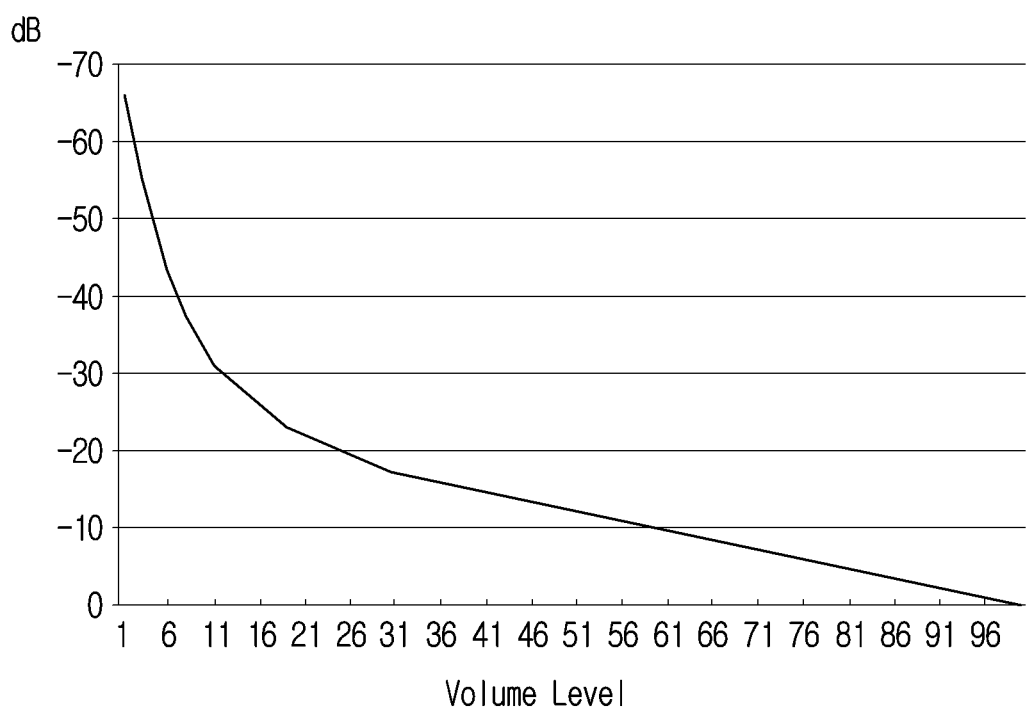
FIG. 4 is a view provided to explain a volume curve graph according to an embodiment.

FIG. 4 is a view provided to explain a volume curve graph according to an embodiment.

If (or based on) the content source is changed from the first content source to the second content source, the processor 120 changes the currently-set volume level to the identified volume level corresponding to the second source. In this case, when (or based on) the volume level is changed abruptly, the sound may be unnaturally recognized or may give an unpleasant feeling to the user. Therefore, the volume level may be provided based on the decibel (dB) that is a value regarding the actual sound level.

For example, a change in volume level from 1 to 10 and a change in volume level from 50 to 60 have the same level difference of 10, but the difference is not the same to the user who is actually listening to the sound. In the above-described volume curve graph, the larger the volume level, the smaller the difference in decibels and as the volume level is relatively larger, the difference in decibels according to the change of the content source may be smaller. Accordingly, even if a new volume level is provided according to the change of the content source, the user may be provided with natural usability.

Accordingly, the processor 120 may identify a volume level corresponding to the second content source by converting the first volume information and the second volume information obtained based on the currently-set volume level and the history of each content source into decibel information based on the above-described volume curve graph.

FIG. 6 is a view provided to explain an exemplary embodiment for identifying a volume level corresponding to a second content source according to an embodiment.

Referring to FIG. 6, in Case 1, it is assumed that the volume history of the first content source and the second content source is generated or determined according to the history in which the content according to the first content source is provided for 3 hours at the volume level of 9 and for 3 hours at the volume level of 11, the content according to the second content source is provided for 2 hours with the volume level of 14 and for 2 hours at the volume level of 16. Based on the volume curve graph, the volume level of 14 may be −28 dB, the volume level of 16 may be −26 dB, the volume level of 9 may be −35 dB, and the volume level of 11 may be −31 dB.

The first volume information based on the volume history of the first content source is 10 (−33 dB) according to the following calculation equation (1).

$$10(-33\text{ dB})=(-35\text{ dB}(9\text{ vol.})*180\text{ minute}+-31\text{ dB}(11\text{ vol.})*180\text{ minute})/(360\text{ minute}) \quad (1)$$

The second volume information based on the volume history of the second content source is 15 (−27 dB) according to the following calculation equation (2).

$$15(-27\text{ dB})=(-28\text{ dB}(14\text{ vol.})*120\text{ minute}+-26\text{ dB}(16\text{ vol.})*120\text{ minute})/(240\text{ minute}) \quad (2)$$

Here, the first volume information and the second volume information are values calculated by the decibel information corresponding to the volume level.

As such, it is assumed that a content is provided from the current first content source after the volume history of the first content source and the second content source is generated and the set volume level is 12 (−30 dB). Subsequently, if the content source is changed to the second content source, the decibel information of the changed second content source may be calculated as −24 dB by adding the difference value (6 dB) between the first volume information (−33 dB) and the second volume information (−27 dB) to the decibel information (−30 dB) corresponding to the currently-set volume level. Based on the volume curve graph, −24 dB corresponds to the volume level of 18. Accordingly, if the content source is changed from the first content source to the second content source, the electronic apparatus 100 may provide sound of −24 dB and display a volume UI including the volume level of 18 on the display 150 for a predetermined time.

Case 2 is an example for describing a case in which the difference value between the first volume information and the second volume information is equal to or greater than a threshold value. For example, it is assumed the volume history of the first content source and the second content source is generated according to the history that the threshold value of the difference value between the first volume information and the second volume information is 10 dB, the content according to the first content source is provided for 3 hours at the volume level of 9 and 3 hours at the volume level of 11, and the content according to the second content source is provided for 3 hours at the volume level of 19 and 3 hours at the volume level of 21.

According to the above-described calculation equations (1) and (2), the first volume information is 10 (−33 dB) and the second volume information is 20 (−22.5 dB).

As such, it is assumed that a content is provided from the current first content source after the volume history of the first content source and the second content source is generated and the set volume level is 12 (−30 dB). Subsequently, if the content source is changed to the second content source, the difference value between the first volume information (−33 dB) and the second volume information (−22.3 dB) is 10.5 dB. However, when the difference value between the first volume information and the second volume information is equal to or greater than 10 dB, it is set to 10 dB. Thus, the difference value between the first volume information and the second volume information may be 10 dB, not 10.5 dB. The decibel information of the changed second content source may be calculated as −20 dB by adding the difference value (10 dB) to the decibel information (−30 dB) corresponding to the currently-set volume level (12). Based on the volume curve graph, −20 dB corresponds to the volume level of 25. Accordingly, if the content source is changed from the content source to the second content source, the electronic apparatus 100 may provide sound of −20 dB and display a volume UI including the volume level of 25 on the display 150 for a predetermined time. As such, it is possible to provide a user with a natural listening feeling by setting the maximum value of the difference value between the first volume information and the second volume information as a threshold value to prevent a sudden increase in decibels when the content source is changed.

Case 3 is a view provided to explain an example where the volume level used during the time when a content is provided from a content source for less than a threshold time is not used in the volume history. For example, it is assumed that the volume history of the first content source and the volume history of the second content source are generated according to a threshold time that is 10 minutes, the content according to the first content source is provided for 3 hours at the volume level of 9 and 3 hours at the volume level of 11, and the content according to the second content source is provided for 5 minutes at the volume level of 10.

According to the above calculation equation (1), the first volume information is 10 (−33 dB) and the volume history of the second content source may not be updated because the content according to the second content source is provided for less than the threshold time. Here, it is assumed that there is no separate volume history of the second content source.

Even though the content is currently provided from the first content source, the set volume level is 12 (−30 dB) and subsequently, the content source is changed to the second content source, the electronic apparatus may maintain the sound of −30 dB and may not display a separate volume UI since the second volume information obtained based on the second volume history does not exist.

Figure 7:
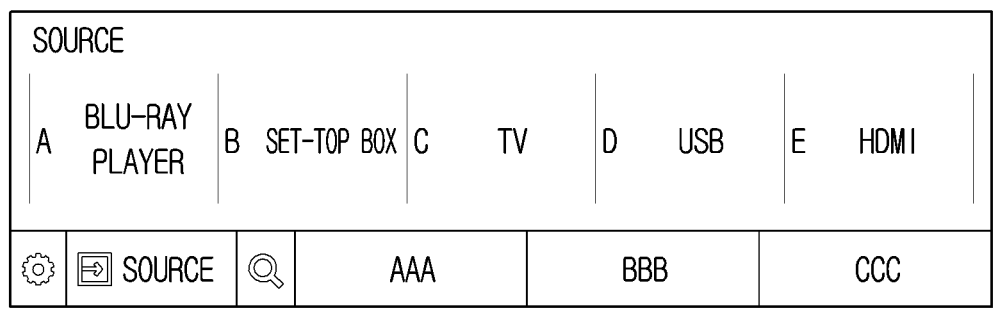
FIG. 7 is a view provided to explain a content source according to an embodiment.

FIG. 7 is a view provided to explain a content source 200 according to an embodiment.

Referring to FIG. 7, the content source 200 may include various sources such as a Blu-ray player, a set-top box, TV broadcast on its own, external source via USB or HDMI, an application (e.g., AAA application), etc. The content source 200 may be selected by a user by entering the UI illustrated in FIG. 7 through the manipulation of a remote controller. In this case, the electronic apparatus 100 may identify the currently-selected content source 200 based on the identification information of the content source 200. Subsequently, if a content is provided from the changed content source 200, the electronic apparatus 100 may provide an optimal volume level based on the volume history, etc., corresponding to the content source 200.

FIG. 8 is a view provided to explain a volume UI according to an embodiment.

If the content source providing a content is changed from the first content source to the second content source, the electronic apparatus 100 may obtain the difference value between the first volume information obtained based on the volume history of the first content source and the second volume information obtained based on the volume history of the second content source, and identify a volume level corresponding to the second content source based on the obtained difference value and the currently-set volume level.

Subsequently, the electronic apparatus 100 may change the currently-set volume level to the identified volume level, and display a volume UI indicating the changed volume level on the display 150 as illustrated in FIG. 8.

For example, if the currently-set volume level is 12 and the changed volume level is 15, the electronic apparatus 100 may display a volume UI in which 15 is displayed.

In order to indicate the volume change step to the user, the electronic apparatus 100 may display the changed volume level. For example, the electronic apparatus 100 may sequentially display the volume UI displaying the volume levels of 13, 14 and 15 to indicate whether the volume level is increased or decreased and the degree of change.

Figure 9:
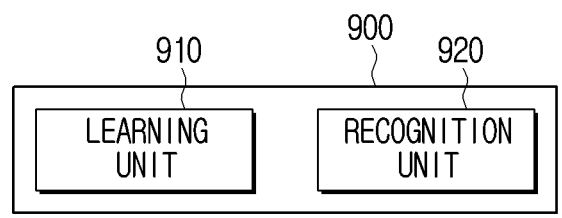
FIG. 9 is a view provided to explain an operation of a learning unit and a recognition unit according to an embodiment.

FIG. 9 is a view provided to explain an operation of a learning unit 910 and a recognition unit 920 according to an embodiment.

Referring to FIG. 9, a processor 900 (e.g., at least one processor) may include at least one of a learning unit 910 and a recognition unit 920. The processor 900 may correspond to the processor 120 of the electronic apparatus 100 or the processor of a data learning device or server.

The learning unit 910 may generate or train a recognition model having a criterion for determining a predetermined situation. The learning unit 910 may generate a recognition model having a criterion using collected training data.

For example, the learning unit 910 may generate, train or update a recognition model having a criterion for identifying volume information corresponding to a content source using existing volume history as training data.

In addition, the learning unit 910 may retrain or update a recognition model having a criterion for identifying volume information using identified volume information.

The recognition unit 920 may estimate a recognition target included in predetermined data using the predetermined data as the input data of a trained recognition model.

For example, the recognition unit 920 may obtain (or estimate or infer) data that is feasible in the input data. For example, if input data for changing the volume level to 100 is input, the recognition unit 920 may identify the input data as unfeasible data and exclude the data from the training data. Here, the feasibility may be identified by whether or not the data is within a predetermined range.

At least part of the learning unit 910 and at least part of the recognition unit 920 may be implemented as a software module or manufactured in the form of at least one hardware chip and mounted on the electronic apparatus 100. For example, at least one of the learning unit 910 and the recognition unit 920 may be manufactured in the form of a hardware chip dedicated for artificial intelligence (AI) or an existing general purpose processor (e.g., a CPU or an application processor), or as part of a graphics (e.g., graphic-only) processor (e.g., a GPU) to be mounted on the aforementioned various electronic apparatuses or object recognition devices. In this case, the hardware chip dedicated for AI is a processor specialized for probability calculation and has higher parallel processing performance than a general purpose processor and thus, may process arithmetic operation quickly in the AI field such as machine learning. When the learning unit 910 and the recognition unit 920 are implemented as a software module (or a program module including instructions), the software module may be stored in a non-transitory computer readable media that is readable by a computer. In this case, the software module may be provided by an Operating System (OS) or by a predetermined application. Alternatively, some of the software modules may be provided by the OS and others may be provided by a predetermined application.

In this case, the learning unit 910 and the recognition unit 920 may be mounted on one electronic apparatus, or may be mounted on separate electronic apparatuses, respectively. For example, one of the learning unit 910 and the recognition unit 920 may be included in the electronic apparatus, and the other may be included in an external server. In addition, the learning unit 910 and the recognition unit may provide model information established by the learning unit 910 to the recognition unit 920 through a wired or wireless connection, and the data input to the recognition unit 920 may be provided to the learning unit 910 as additional training data.

Figure 10:
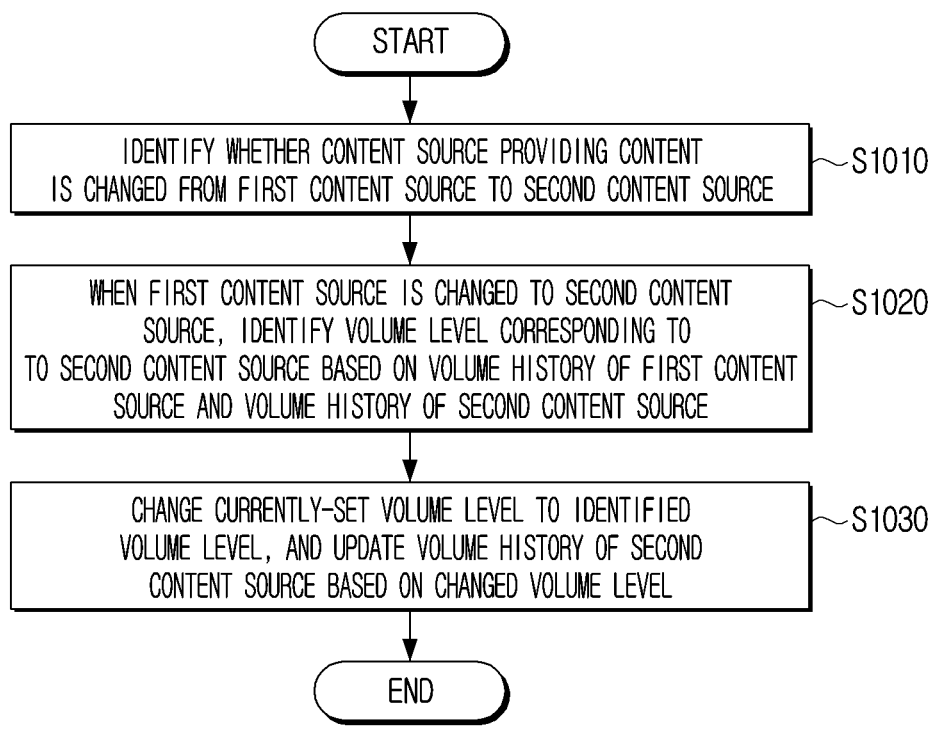
FIG. 10 is a flowchart provided to explain a controlling method of an electronic apparatus that stores a volume history for each content source according to an embodiment.

FIG. 10 is a flowchart provided to explain a controlling method of an electronic apparatus 100 that stores a volume history for each content source according to an embodiment.

Referring to FIG. 10, the electronic apparatus 100 may identify whether the content source providing a content is changed from a first content source to a second content source (operation S1010).

When (or based on) the content source is changed from the first content source to the second content source, the electronic apparatus 100 may identify a volume level corresponding to the second content source based on the volume history of the first content source and the volume history of the second content source (operation S1020).

Specifically, the electronic apparatus 100 may obtain a difference value between the first volume information obtained based on the volume history of the first content source and the second volume information obtained based on the volume history of the second content source, and identify a volume level corresponding to the second content source based on the obtained difference value and the currently-set volume level.

Here, the electronic apparatus may obtain decibel information corresponding to the second content source based on decibel information corresponding to the obtained difference value and decibel information corresponding to the currently-set volume level, and identify a volume level corresponding to the obtained decibel information as a volume level corresponding to the second content source. In other words, the electronic apparatus 100 may convert the volume level into corresponding decibel information and identify a volume level corresponding to the second content source.

Here, the volume history of each of the first content source and the second content source may include volume information for each time section (or time period).

In addition, the electronic apparatus 100 may obtain the first volume information of a time section corresponding to the present time based on volume information for each time section of the first content source, obtain the second volume information of a time section corresponding to the present time based on volume information for each time section of the second content source, and identify a volume level corresponding to the second content source based on the obtain difference value between the first volume information and the second volume information and the currently-set volume level.

The electronic apparatus 100 may change the currently-set volume level to the identified volume level, and update the volume history of the second content source based on the changed volume level (operation S1030).

Specifically, the electronic apparatus 100 may update information of at least one time section corresponding to the volume history of the second content source based on the volume information and time information during the time when the second content source is provided.

In addition, if (or based on) at least one of an event where the content source is changed, an event where the turn on state of the electronic apparatus is changed, or an event where the volume setting is changed occurs, the electronic apparatus 100 may update the stored volume history.

Further, when a content is provided from the changed second content source for more than a threshold time, the electronic apparatus 100 may update the volume history of the second content source based on the changed volume level.

Meanwhile, the volume history of each of the first content source and the second content source may include volume information for each time section corresponding to a weekday and volume information for each time section corresponding to a weekend, or may include volume information for each time section corresponding to a specific day of the week.

The electronic apparatus 100 may display a volume UI indicating the changed volume level.

Meanwhile, the electronic apparatus 100 may manage volume history for each content source using a learning network model.

It is understood that methods according to one or more embodiments (including those described above) may be implemented in the form of software or an application that can be installed on a related art electronic apparatus.

Also, methods according to one or more embodiments (including those described above) may be implemented only by software upgrade, or hardware upgrade of a related art electronic apparatus.

In addition, the aforementioned various embodiments may be performed through an embedded server provided on an electronic apparatus or on external server of the electronic apparatus.

Further, one or more embodiments may be implemented as software including instructions that can be stored in machine-readable storage media, which can be read by a machine (e.g., computers). The machine refers to an apparatus that calls instructions stored in a storage medium, and can operate according to the called instructions, and the apparatus may include an electronic apparatus according to an embodiment. When an instruction is executed by a processor, the processor may perform a function corresponding to the instruction by itself, or by using other components under its control. The instruction may include a code that is generated or executed by a compiler or an interpreter. The storage medium that is readable by machine may be provided in the form of a non-transitory storage medium. Here, the term "non-transitory" is a storage medium that does not include signals, and is tangible, but does not indicate whether data is stored in the storage medium semi-permanently or temporarily.

In addition, a method according to one or more embodiments (such as those described above) may be provided while being included in a computer program product. A computer program product refers to a product, and can be traded between a seller and a buyer. The computer program product can be distributed online in the form of a storage medium that is readable by machines (e.g., a compact disc read only memory (CD-ROM)), or through an application store (e.g., PLAY STORE). In the case of online distribution, at least a portion of the computer program product may be stored in a storage medium such as the server of the manufacturer, the server of the application store, and the memory of the relay server at least temporarily, or may be generated temporarily.

In addition, one or more embodiments (including from among the aforementioned various embodiments) may be implemented in a computer or a recording medium that can be read by a device similar to a computer by using software, hardware or a combination thereof. In some cases, one or more embodiments may be implemented as a processor itself. Meanwhile, according to implementation by software, the embodiments such as procedures and functions described in this specification may be implemented as separate software modules. Each of the software modules may perform one or more functions and operations described in this specification.

Computer instructions for performing processing operations of devices according to one or more embodiments may be stored in a non-transitory computer-readable medium. When computer instructions stored in such a non-transitory computer-readable medium are executed by the processor of a specific device, processing operations at devices according to one or more embodiments are made to be performed by the specific device.

A non-transitory computer-readable medium refers to a medium that stores data semi-permanently, and is readable by machines, but not a medium that stores data for a short moment such as a register, a cache, and a memory. As specific examples of a non-transitory computer-readable medium, there may be a CD, a DVD, a hard disc, a blue-ray disc, a USB, a memory card, a ROM and the like.

Also, each of the components according to one or more embodiments (e.g., a module or a program) may consist of a singular object or a plurality of objects. In addition, among the aforementioned corresponding sub components, some sub components may be omitted, or other sub components may be further included in the various embodiments. Generally or additionally, some components (e.g., a module or a program) may be integrated as an object, and perform the functions that were performed by each of the components before integration identically or in a similar manner. Operations performed by a module, a program, or other components according to the various embodiments may be executed sequentially, in parallel, repetitively, or heuristically. Or, at least some of the operations may be executed in a different order, or omitted, or other operations may be added.

While one or more embodiments have been shown and described above, the disclosure is not limited to the aforementioned specific embodiments, and it is apparent that various modifications can be made by those having ordinary skill in the art to which the disclosure belongs, without departing from the gist of the disclosure at least as claimed by the appended claims, and such modifications are not to be interpreted independently from the technical idea or prospect of the disclosure.

What is claimed is:

1. An electronic apparatus comprising:
   a memory configured to store volume histories for a plurality of content sources, wherein the volume histories include volume information for each of a plurality of time periods; and
   a processor configured to, based on a content source for providing a content being changed from a first content source to a second content source, among the plurality of content sources;
   identify a volume level corresponding to the second content source by using first volume information of a time period corresponding to a present time based on the volume information for each of the plurality of time periods of the first content source and second volume information of the time period corresponding to the present time based on the volume information for each of the plurality of time periods of the second content source, and
   change a currently-set volume level to the identified volume level, and update a volume history of the second content source based on the changed volume level.

2. The electronic apparatus as claimed in claim 1, wherein the processor is configured to:
   obtain a difference value between the first volume information obtained based on a volume history of the first content source and the second volume information obtained based on the volume history of the second content source; and
   identify the volume level corresponding to the second content source based on the obtained difference value and the currently-set volume level.

3. The electronic apparatus as claimed in claim 2, wherein the processor is configured to obtain decibel information corresponding to the second content source based on decibel information corresponding to the obtained difference value and decibel information corresponding to the currently-set volume level, and identify a volume level corresponding to the obtained decibel information as the volume level corresponding to the second content source.

4. The electronic apparatus as claimed in claim 1, wherein:
   a volume history of the first content source and the volume history of the second content source each include the volume information for each of a plurality of time periods; and
   the processor is configured to:
      obtain the first volume information of the time period corresponding to the present time based on the volume information for each of the plurality of time periods of the first content source,
      obtain the second volume information of the time period corresponding to the present time based on the volume information for each of the plurality of time periods of the second content source, and
      identify the volume level corresponding to the second content source based on an obtained difference value between the first volume information and the second volume information and the currently-set volume level.

5. The electronic apparatus as claimed in claim 1, wherein:
   a volume history of the first content source and the volume history of the second content source each include the volume information for each of a plurality of time periods; and
   the processor is configured to update volume information for at least one corresponding time period from among the plurality of time periods for the volume history of the second content source based on volume information and time information during a time in which the second content source is providing content.

6. The electronic apparatus as claimed in claim 1, wherein the processor is configured to, based on at least one of an event in which the content source is changed, an event in which a turn-on state of the electronic apparatus is changed, or an event in which a volume setting is changed occurring, update the volume history of the second content source stored in the memory.

7. The electronic apparatus as claimed in claim 1, wherein the processor is configured to, based on a content being provided from the second content source for a threshold length of time or more, update the volume history of the second content source based on the changed currently-set volume level.

8. The electronic apparatus as claimed in claim 1, wherein a volume history of the first content source and the volume history of the second content source each include volume information for time periods corresponding to a weekday and volume information for time periods corresponding to a weekend.

9. The electronic apparatus as claimed in claim 1, further comprising:
a display,
wherein the processor is configured to control the display to display a volume user interface (UI) indicating the changed currently-set volume level.

10. The electronic apparatus as claimed in claim 1, wherein the processor is configured to manage the volume histories for the plurality of content sources using a learning network model.

11. A controlling method of an electronic apparatus that stores volume histories for a plurality of content sources, wherein the volume histories include volume information for each of a plurality of time periods, the method comprising:
based on a content source for providing a content being changed from a first content source to a second content source, among the plurality of content sources, identifying a volume level corresponding to the second content source by using first volume information of a time period corresponding to a present time based on the volume information for each of the plurality of time periods of the first content source and second volume information of the time period corresponding to the present time based on the volume information for each of the plurality of time periods of the second content source, and
changing a currently-set volume level to the identified volume level, and updating a volume history of the second content source based on the changed volume level.

12. The method as claimed in claim 11, wherein the identifying the volume level comprises:
obtaining a difference value between the first volume information obtained based on a volume history of the first content source and the second volume information obtained based on the volume history of the second content source, and
identifying the volume level corresponding to the second content source based on the obtained difference value and the currently-set volume level.

13. The method as claimed in claim 12, wherein the identifying the volume level based on the obtained difference value and the currently-set volume level comprises obtaining decibel information corresponding to the second content source based on decibel information corresponding to the obtained difference value and decibel information corresponding to the currently-set volume level, and identifying a volume level corresponding to the obtained decibel information as the volume level corresponding to the second content source.

14. The method as claimed in claim 11, wherein:
a volume history of the first content source and the volume history of the second content source each include the volume information for each of a plurality of time periods; and
the identifying the volume level comprises:
obtaining the first volume information of the time period corresponding to the present time based on the volume information for each of the plurality of time periods of the first content source,
obtaining the second volume information of the time period corresponding to the present time based on the volume information for each of the plurality of time periods of the second content source, and
identifying the volume level corresponding to the second content source based on an obtained difference value between the first volume information and the second volume information and the currently-set volume level.

15. The method as claimed in claim 11, wherein:
a volume history of the first content source and the volume history of the second content source each include the volume information for each of a plurality of time periods; and
the updating comprises updating volume information for at least one corresponding time period from among the plurality of time periods for the volume history of the second content source based on volume information and time information during a time in which the second content source is providing content.

16. The method as claimed in claim 11, wherein the updating comprises, based on at least one of an event in which the content source is changed, an event in which a turn-on state of the electronic apparatus is changed, or an event in which a volume setting is changed occurring, updating the volume history of the second content source.

17. The method as claimed in claim 11, wherein the updating comprises, based on a content being provided from the second content source for a threshold length of time or more, updating the volume history of the second content source based on the changed currently-set volume level.

18. The method as claimed in claim 11, wherein a volume history of the first content source and the volume history of the second content source each include volume information for time periods corresponding to a weekday and volume information for time periods corresponding to a weekend.

19. The method apparatus as claimed in claim 11, further comprising:
displaying a volume UI indicating the changed currently-set volume level.

20. The method as claimed in claim 11, wherein the updating comprises managing the volume histories for the plurality of content sources using a learning network model.

21. An electronic apparatus comprising:
a memory configured to store volume histories for a plurality of content sources; and
a processor configured to:
based on a content source for providing a content being changed from a first content source to a second content source, among the plurality of content sources, obtain first volume information of a time period corresponding to a present time based on volume information for each of a plurality of time periods of the first content source included in a volume history of the first content source, obtain second volume information of the time period corresponding to the present time based on volume information for each of a plurality of time periods of the second content source included in a volume history of the second content source;
obtain a difference value between the first volume information and the second volume information;
obtain decibel information corresponding to the second content source based on decibel information corresponding to the obtained difference value and decibel information corresponding to a currently-set volume level;

identify a volume level corresponding to the second content source based on the obtained decibel information corresponding to the second content source;
change the currently-set volume level to the identified volume level; and
based on a content being provided from the second content source for a threshold length of time or more, update the volume history of the second content source based on the changed volume level.

* * * * *